(12) United States Patent
Hashimoto et al.

(10) Patent No.: US 10,910,214 B2
(45) Date of Patent: Feb. 2, 2021

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Masanori Nakayama, Toyama (JP); Masaya Nagato, Toyama (JP); Tatsuru Matsuoka, Toyama (JP); Hiroki Tamashita, Toyama (JP); Takafumi Nitta, Toyama (JP); Satoshi Shimamoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 121 days.

(21) Appl. No.: 15/982,804

(22) Filed: May 17, 2018

(65) Prior Publication Data
US 2018/0337031 A1 Nov. 22, 2018

(30) Foreign Application Priority Data
May 19, 2017 (JP) .................................. 2017-099456

(51) Int. Cl.
*H01L 21/02* (2006.01)
*C23C 16/455* (2006.01)
(Continued)

(52) U.S. Cl.
CPC ............ *H01L 21/022* (2013.01); *C23C 16/36* (2013.01); *C23C 16/4554* (2013.01);
(Continued)

(58) Field of Classification Search
CPC ...................... H01L 21/02126; H01L 21/0214
See application file for complete search history.

(56) References Cited

U.S. PATENT DOCUMENTS

| 2013/0252435 A1 | 9/2013 | Shimamoto et al. |
| 2015/0004804 A1 | 1/2015 | Orihashi et al. |

(Continued)

FOREIGN PATENT DOCUMENTS

| JP | 2006-253666 A | 9/2006 |
| JP | 2009-182000 A | 8/2009 |

(Continued)

OTHER PUBLICATIONS

Japanese Office Action dated Jun. 30, 2020 for the Japanese Patent Application No. 2017-099456.

*Primary Examiner* — Stephen W Smoot
*Assistant Examiner* — Sun Mi Kim King
(74) *Attorney, Agent, or Firm* — Volpe Koenig

(57) ABSTRACT

A method of manufacturing a semiconductor device includes: providing a substrate that includes a surface exposing a first film containing silicon, oxygen, carbon and nitrogen and having an oxygen atom concentration higher than a silicon atom concentration, which is higher than a carbon atom concentration, which is equal to or higher than a nitrogen atom concentration; and changing a composition of a surface of the first film so that the nitrogen atom concentration becomes higher than the carbon atom concentration on the surface of the first film, by supplying a plasma-excited nitrogen-containing gas to the surface of the first film.

14 Claims, 8 Drawing Sheets

(51) Int. Cl.
  *H01J 37/32* (2006.01)
  *H01L 21/3115* (2006.01)
  *C23C 16/36* (2006.01)

(52) U.S. Cl.
  CPC .. *C23C 16/45536* (2013.01); *C23C 16/45544* (2013.01); *H01J 37/32449* (2013.01); *H01L 21/0228* (2013.01); *H01L 21/0234* (2013.01); *H01L 21/02126* (2013.01); *H01L 21/02211* (2013.01); *H01L 21/02274* (2013.01); *H01L 21/02329* (2013.01); *H01L 21/3115* (2013.01); *H01J 37/32541* (2013.01); *H01J 2237/332* (2013.01)

(56) References Cited

U.S. PATENT DOCUMENTS

| | | | |
|---|---|---|---|
| 2015/0145073 A1* | 5/2015 | Lee | H01L 29/6656 257/411 |
| 2016/0322218 A1* | 11/2016 | Fukiage | C23C 16/45565 |
| 2017/0040157 A1 | 2/2017 | Hashimoto et al. | |
| 2017/0103885 A1* | 4/2017 | Nakamura | H01L 21/3086 |

FOREIGN PATENT DOCUMENTS

| | | |
|---|---|---|
| JP | 2013-225657 A | 10/2013 |
| JP | 2015-012196 A | 1/2015 |
| JP | 2017-034196 A | 2/2017 |

\* cited by examiner

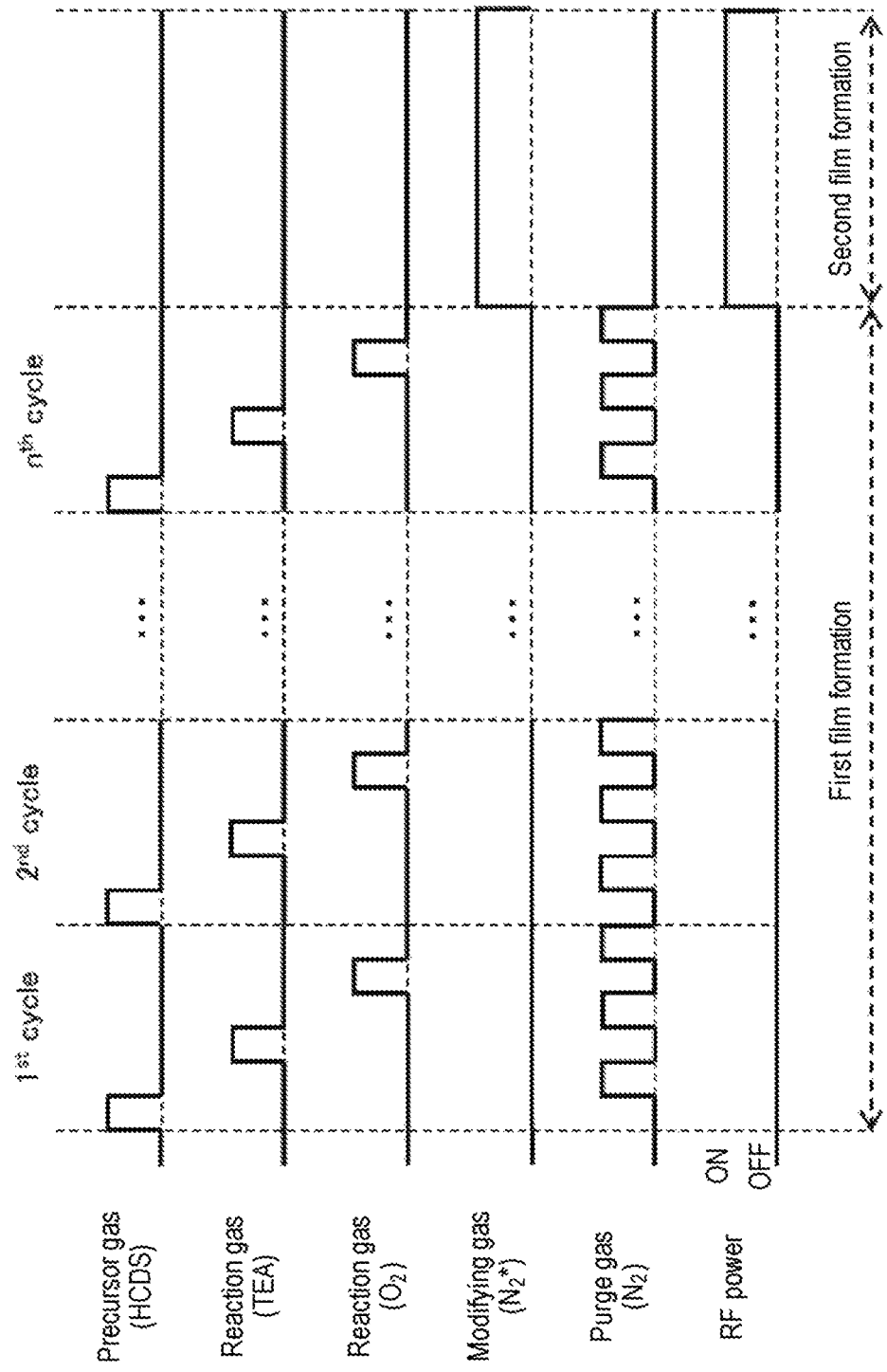

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-099456, filed on May 19, 2017, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a multi-component film containing silicon (Si), oxygen (O), carbon (C) and nitrogen (N) may be performed on a substrate in the related art.

SUMMARY

The present disclosure provides some embodiments of a technique capable of improving the properties of a film formed on a substrate.

According to one embodiment of the present disclosure, there is provided a technique, including: providing a substrate that includes a surface exposing a first film containing silicon, oxygen, carbon and nitrogen and having an oxygen atom concentration higher than a silicon atom concentration, which is higher than a carbon atom concentration, which is equal to or higher than a nitrogen atom concentration; and changing a composition of a surface of the first film so that the nitrogen atom concentration becomes higher than the carbon atom concentration on the surface of the first film by supplying a plasma-excited nitrogen-containing gas to the surface of the first film.

BRIEF DESCRIPTION OF DRAWINGS

FIG. 4 is a diagram showing a film-forming sequence according to one embodiment of the present disclosure.

DETAILED DESCRIPTION

One Embodiment of the Present Disclosure

One embodiment of the present disclosure will now be described with reference to FIGS. 1 to 5B.

(1) Configuration of Substrate Processing Apparatus

Figure 1:
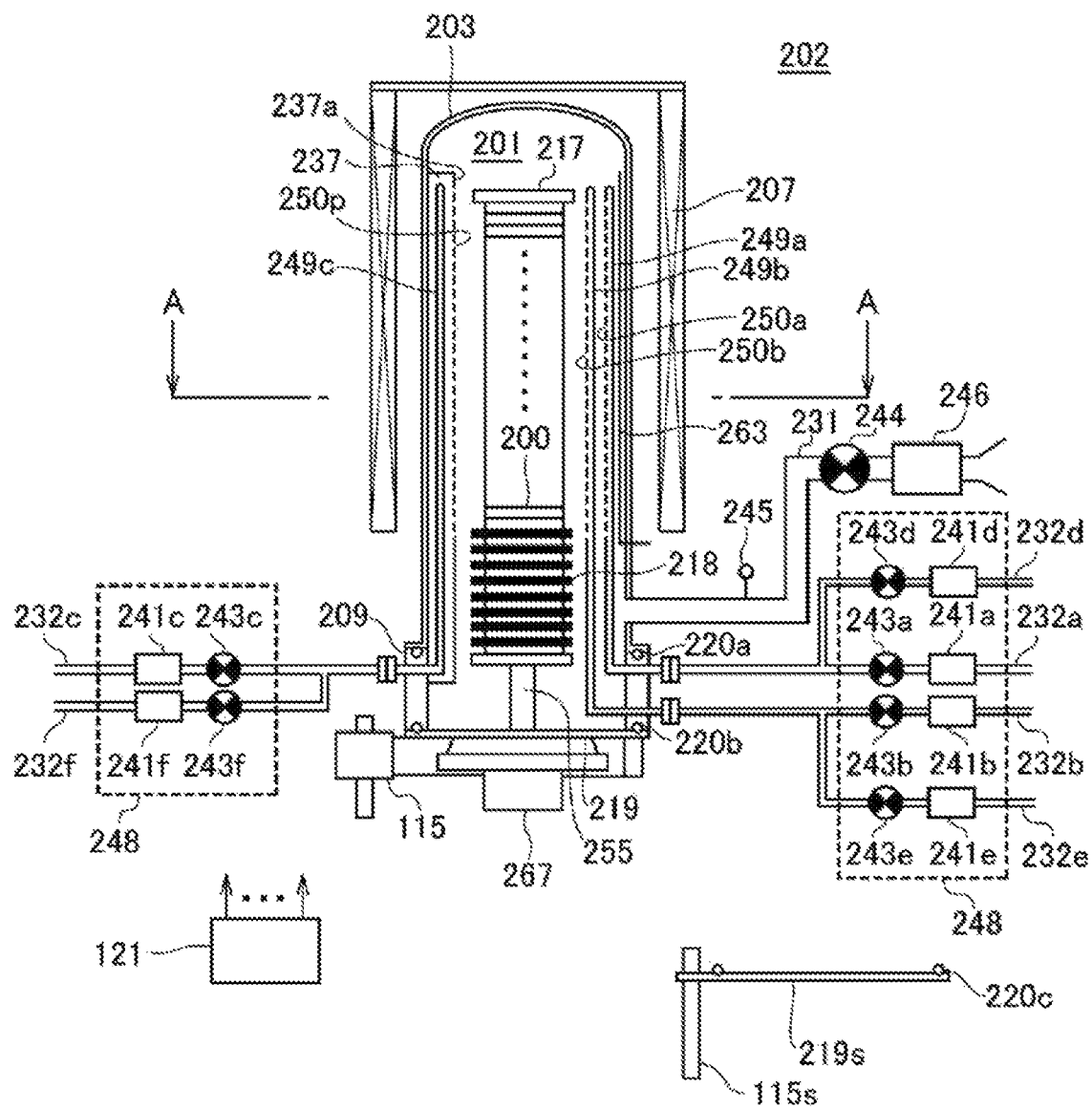
FIG. 1 is a schematic configuration diagram of a vertical process furnace of a substrate processing apparatus used in one embodiment of the present disclosure, in which a part of the process furnace is shown in a vertical sectional view.

As shown in FIG. 1, a process furnace 202 includes a heater 207 as a heating mechanism (temperature adjusting part). The heater 207 has a cylindrical shape and is vertically installed by being supported by a holding plate. The heater 207 also functions as an activation mechanism (excitation part) that thermally activates (excites) a gas.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with its upper end closed and its lower end opened. Under the reaction tube 203, a manifold 209 is disposed concentrically with the reaction tube 203. The manifold 209 is made of a metallic material such as, for example, stainless steel (SUS) or the like and is formed in a cylindrical shape with its upper and lower ends opened. The upper end portion of the manifold 209 is engaged with the lower end portion of the reaction tube 203 and is configured to support the reaction tube 203. An O ring 220a as a seal member is installed between the manifold 209 and the reaction tube 203. The reaction tube 203 is vertically installed just like the heater 207. A process vessel (reaction vessel) includes the reaction tube 203 and the manifold 209. A process chamber 201 is formed in the hollow portion of the process vessel. The process chamber 201 is configured to be able to accommodate wafers 200 as substrates.

In the process chamber 201, nozzles 249a to 249c are installed so as to penetrate the side wall of the manifold 209. Gas supply pipes 232a to 232c are connected to the nozzles 249a to 249c, respectively.

Mass flow controllers (MFC) 241a to 241c as flow rate controllers (flow rate control parts) and valves 243a to 243c as opening/closing valves are installed at the gas supply pipes 232a to 232c in order from the upstream side of a gas flow. Gas supply pipes 232d to 232f are connected to the gas supply pipes 232a to 232c, respectively, on the downstream side of the valves 243a to 243c. MFCs 241d to 241f and valves 243d to 243f are installed at the gas supply pipes 232d to 232f in order from the upstream side of a gas flow.

Figure 2:
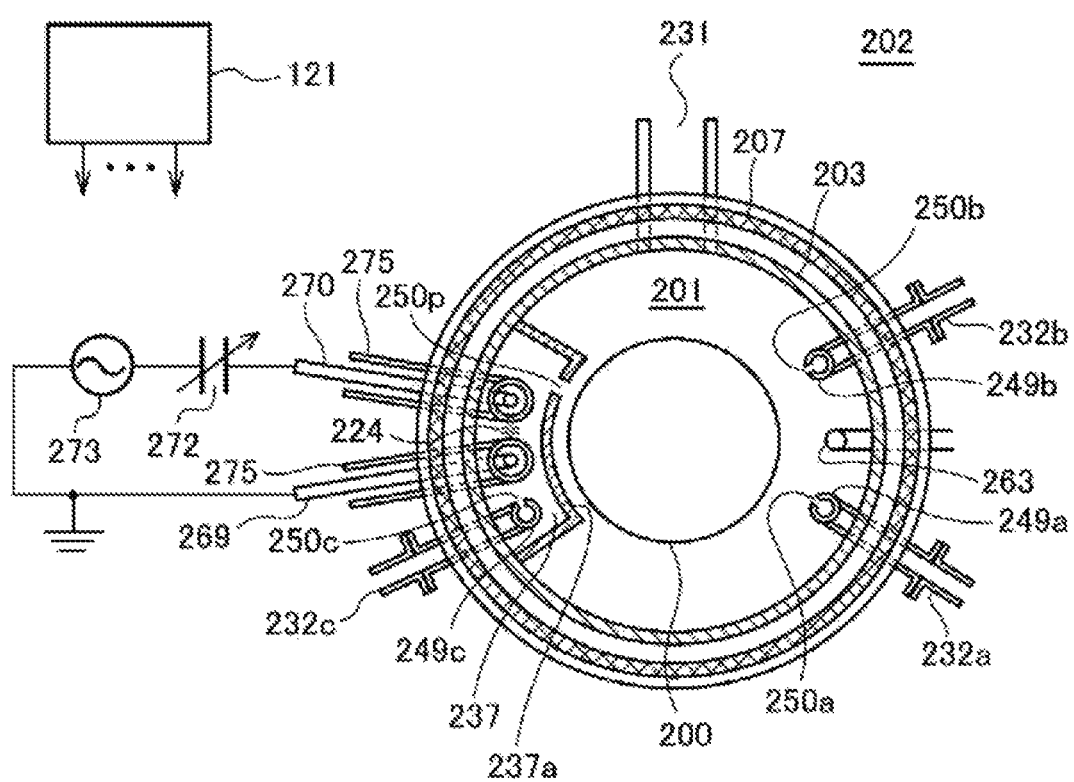
FIG. 2 is a schematic configuration diagram of a vertical process furnace of a substrate processing apparatus used in one embodiment of the present disclosure, in which the process furnace is shown in a sectional view taken along line A-A in FIG. 1.

As shown in FIG. 2, the nozzles 249a to 249c are arranged in an annular space in a plan view between the inner wall of the reaction tube 203 and the wafers 200 and are installed so as to extend upward in the stacking direction of the wafers 200 from the lower portion of the inner wall of the reaction tube 203 to the upper portion thereof. In other words, the nozzles 249a to 249c are respectively installed in a region existing on the side of a wafer arrangement region, in which the wafers 200 are arranged, and horizontally surrounding the wafer arrangement region, so as to extend along the wafer arrangement region. Gas supply holes 250a to 250c for supplying gases are formed on the side surfaces of the nozzles 249a to 249c, respectively. The gas supply holes 250a and 250b are respectively opened to face the center of the reaction tube 203 and are capable of supplying gases toward the wafers 200. The gas supply holes 250c are opened to face the center of a buffer chamber 237 which will be described later. The gas supply holes 250a to 250c are respectively formed over a region from the lower portion to the upper portion of the reaction tube 203.

The nozzle 249c is installed in a buffer chamber 237, which is a gas dispersion space. The buffer chamber 237 is formed between an inner wall of the reaction tube 203 and a partition wall 237a. The buffer chamber (partition wall 237a) is installed in an annular space in a plan view between the inner wall of the reaction tube 203 and the wafers 200 and in a region extending from the lower portion of the inner wall of the reaction tube 203 to the upper portion thereof, so as to extend along the stacking direction of the wafers 200. That is, the buffer chamber 237 (partition wall 237a) is installed in a region existing on the lateral side of the wafer arrangement region and horizontally surrounding the wafer arrangement region, so as to extend along the wafer arrangement region. Gas supply holes 250p for supplying gases are formed at an end portion of the surface of the partition wall 237a opposite to (adjacent to) the wafers 200. The gas supply holes 250p are opened to face the center of the reaction tube 203 and are capable of supplying gases toward the wafers 200. The gas supply holes 250p are formed over a region from the lower portion to the upper portion of the reaction tube 203.

As a precursor gas, a Si-containing gas (halosilane gas) containing Si as a main element constituting a film to be formed and a halogen element is supplied from the gas supply pipe 232a into the process chamber 201 via the MFC 241a, the valve 243a and the nozzle 249a. The precursor gas refers to a precursor in a gaseous state, for example, a gas obtained by vaporizing a precursor staying in a liquid state under a room temperature and an atmospheric pressure, a precursor staying in a gaseous state under a room temperature and an atmospheric pressure, or the like. The halogen element includes chlorine (Cl), fluorine (F), bromine (Br), iodine (I), etc. The halosilane gas acts as a Si source. For example, a chlorosilane gas containing Cl may be used as the halosilane gas. For example, a hexachlorodisilane ($Si_2Cl_6$, abbreviation: HCDS) gas may be used as the chlorosilane gas.

As a first reaction gas, a gas containing N and C is supplied from the gas supply pipe 232b into the process chamber 201 via the MFC 241b, the valve 243b and the nozzle 249b. For example, an amine-based gas may be used as the gas containing N and C. The amine-based gas may also be a substance composed of only three elements, N, C and hydrogen (H), and may act as an N source and a C source. For example, a triethylamine (($C_2H_5$)$_3$N, abbreviation: TEA) gas may be used as the amine-based gas.

As a second reaction gas, an O-containing gas is supplied from the gas supply pipe 232c into the process chamber 201 via the MFC 241c, the valve 243c, the nozzle 249c and the buffer chamber 237. The O-containing gas acts as an oxidizing gas, i.e., an O source. For example, an oxygen ($O_2$) gas may be used as the O-containing gas.

As a H-containing gas, for example, a hydrogen ($H_2$) gas is supplied from the gas supply pipe 232c into the process chamber 201 via the MFC 241c, the valve 243c, the nozzle 249c and the buffer chamber 237.

As an N-containing gas, for example, a nitrogen ($N_2$) gas is supplied from the gas supply pipes 232d to 232f into the process chamber 201 via the MFCs 241d to 241f, the valves 243d to 243f, the gas supply pipes 232a to 232c, the nozzles 249a to 249c and the buffer chamber 237, respectively. The $N_2$ gas acts as a purge gas (inert gas) and the like. Furthermore, the $N_2$ gas supplied from the gas supply pipe 232f is excited by plasma and, therefore, acts as a modifying gas that changes the composition of the surface of a first film which will be described later.

A Si-containing gas supply system includes the gas supply pipe 232a, the MFC 241a and the valve 243a. An N- and C-containing gas supply system includes the gas supply pipe 232b, the MFC 241b and the valve 243b. Each of an O-containing gas supply system and an H-containing gas supply system includes the gas supply pipe 232c, the MFC 241c and the valve 243c. An N-containing gas supply system includes the gas supply pipes 232d to 232f, the MFCs 241d to 241f and the valves 243d to 243f.

One or all of the above-mentioned various supply systems may be configured as an integrated supply system 248 formed by integrating the valves 243a to 243f, the MFCs 241a to 241f and the like. The integrated supply system 248 are connected to each of the gas supply pipes 232a to 232f and are configured so that the supply operations of the various gases into the gas supply pipes 232a to 232f, i.e., the opening/closing operation of the valves 243a to 243f, the flow rate adjusting operation of the MFCs 241a to 241f, and the like can be controlled by a controller 121 which will be described later. The integrated supply system 248 may be integral or may be formed of split-type integrated units. The integrated supply system 248 may be attached to and detached from the gas supply pipes 232a to 232f or the like on an integrated unit basis. The maintenance, replacement, expansion or the like of the integrated supply system 248 may be performed on an integrated unit basis.

In the buffer chamber 237, two rod-shaped electrodes 269 and 270 made of a conductive material and having an elongated structure are installed to stand up from the lower portion of the inner wall of the reaction tube 203 toward the upper portion thereof in the stacking direction of the wafers 200. The rod-shaped electrodes 269 and 270 are installed in parallel with the nozzle 249c respectively. The rod-shaped electrodes 269 and 270 are respectively protected by being covered with electrode protection tubes 275 from the upper portion to the lower portion thereof. One of the rod-shaped electrodes 269 and 270 is connected to a high-frequency power supply 273 via a matcher 272, and the other is connected to the ground which is a reference potential. By applying high frequency (RF) power from the high-frequency power supply 273 to between the rod-shaped electrodes 269 and 270, plasma is generated in a plasma generation region 224 between the rod-shaped electrodes 269 and 270. A plasma excitation part (activation mechanism) for exciting (activating) a gas into a plasma state includes the rod-shaped electrodes 269 and 270 and the electrode protection tubes 275. The matcher 272 and the high-frequency power supply 273 may be included in the plasma excitation part.

An exhaust pipe 231 for exhausting the atmosphere inside the process chamber 201 is connected to the lower side of the side wall of the reaction tube 203. A vacuum pump 246 as a vacuum evacuation device is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The APC valve 244 is configured so that the vacuum evacuation of the interior of the process chamber 201 and stopping the vacuum evacuation can be performed by opening and closing the APC valve 244 in a state in which the vacuum pump 246 is operated, and so that the pressure inside the process chamber 201 can be adjusted by adjusting the valve opening degree based on the pressure information detected by the pressure sensor 245 in a state in which the vacuum pump 246 is operated. An exhaust system includes the exhaust pipe 231, the APC valve 244 and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of a metallic material such as, for example, SUS or the like and is formed in a disc shape. On the upper surface of the seal cap 219, there is installed an O ring 220b as a seal member which makes contact with the lower end of the manifold 209. Below the seal cap 219, there is installed a rotation mechanism 267 for rotating a boat 217 to be described later. A rotating shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising and lowering the seal cap 219. Further, under the manifold 209, there is installed a shutter 219s as a furnace opening lid capable of airtightly closing the lower end opening of the manifold 209 in a state in which the seal cap 219 is lowered to unload the boat 217 from the process chamber 201. The shutter 219s is made of a metallic material such as, for example, SUS, and is formed in a disk shape. On the upper surface of the shutter 219s, there is installed an O-ring 220c as a seal member which makes contact with the lower end of the manifold 209. The opening and closing operations (the elevating operation, the rotating operation and the like) of the shutter 219s are controlled by a shutter opening/closing mechanism 115s.

The boat 217 as a substrate support tool is configured so as to support a plurality of wafers 200, for example, 25 to 200 wafers 200 at multiple stages in a horizontal posture and in a vertically-aligned state with their centers aligned with one another, namely so as to arrange the wafers 200 at intervals. The boat 217 is made of a heat-resistant material such as, for example, quartz or SiC. Heat insulating plates 218 made of a heat resistant material such as, for example, quartz or SIC are disposed at multiple stages in the lower portion of the boat 217.

In the reaction tube 203, there is installed a temperature sensor 263 as a temperature detector. By adjusting a state of supplying electrical power to the heater 207 based on the temperature information detected by the temperature sensor 263, the temperature inside the process chamber 201 is controlled to have a desired temperature distribution. The temperature sensor 263 is installed along the inner wall of the reaction tube 203.

Figure 3:
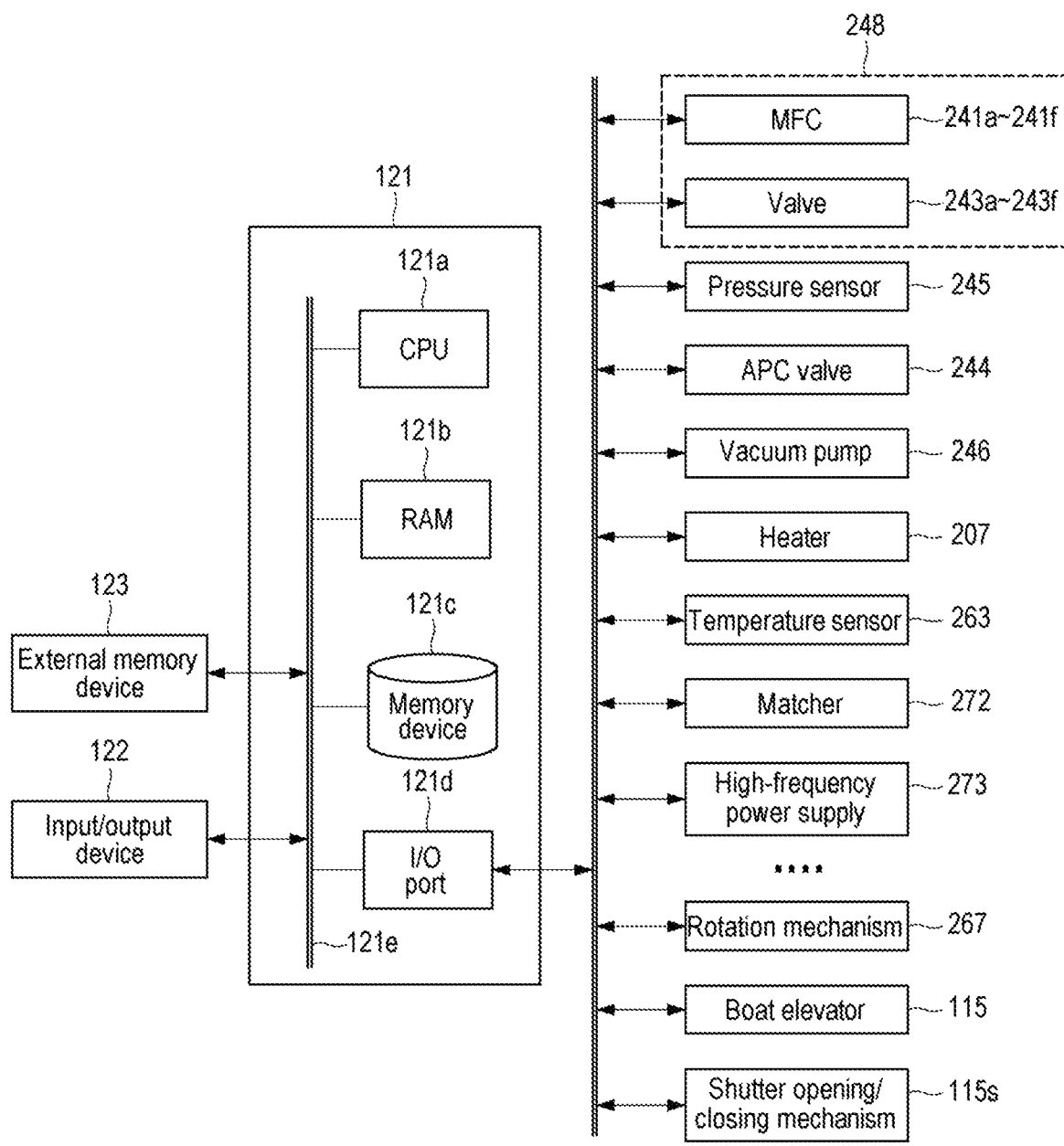
FIG. 3 is a schematic configuration diagram of a controller of a substrate processing apparatus used in one embodiment of the present disclosure, in which a control system of a controller is shown in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c, and the I/O port 121d are configured to exchange data with the CPU 121a via an internal bus 121e. An input/output device 122 including, for example, a touch panel or the like is connected to the controller 121.

The memory device 121c includes, for example, a flash memory, a hard disc drive (HDD), or the like. A control program for controlling the operations of the substrate processing apparatus, a process recipe in which sequences and conditions of a film-forming process to be described later are written, or the like is readably stored in the memory device 121c. The process recipe functions as a program for causing the controller 121 to execute each sequence in the film-forming process, which will be described later, to obtain a predetermined result. Hereinafter, the process recipe and the control program will be generally and simply referred to as a program. Further, the process recipe will be simply referred to as a recipe. When the term "program" is used herein, it may indicate a case of including only the process recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the high-frequency power supply 273, and the like.

The CPU 121a is configured to read the control program from the memory device 121c and execute the same. The CPU 121a is also configured to read the process recipe from the memory device 121c in response to an input of an operation command from the input/output device 122, and the like. The CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the opening/closing operation of the shutter 219s by the shutter opening/closing mechanism 115s, the impedance adjusting operation by the matcher 272, the supply of electric power to the high-frequency power supply 273, and the like.

The controller 121 may be configured by installing, in a computer, the aforementioned program stored in an external memory device (for example, a magnetic disk such as a HDD or the like, an optical disk such as a CD or the like, a magneto-optical disk such as an MO or the like, or a semiconductor memory such as a USB memory or the like) 123. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Film-Forming Process

Figure 5A:
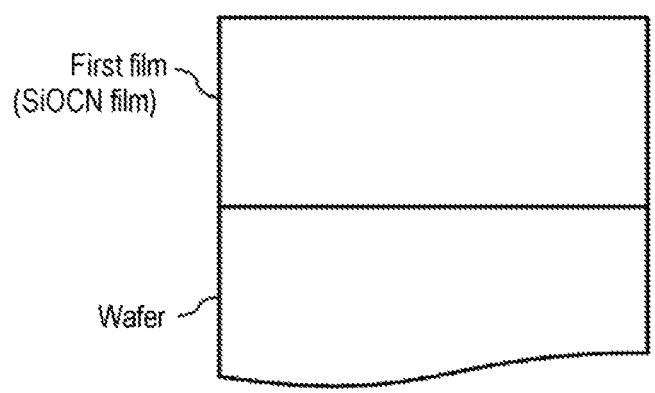
FIG. 5A is an enlarged sectional view of a surface of a substrate showing a state after a first film is formed on the substrate.
Figure 5B:
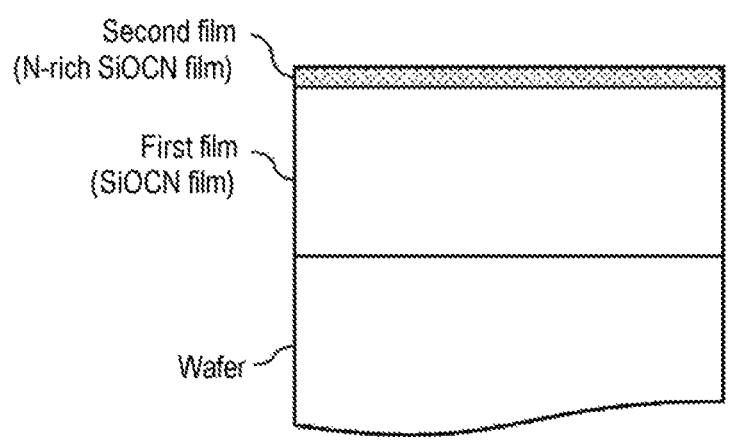
FIG. 5B is an enlarged sectional view of a surface of a substrate showing a state after a second film is formed on the surface of the first film by changing the composition of the surface of the first film.

A sequence example of forming a silicon oxycarbonitride film (SiOCN film) on a wafer 200 as a substrate using the aforementioned substrate processing apparatus, which is one of the processes for manufacturing a semiconductor device, will be described below with reference to FIGS. 4, 5A and 5B. In the following descriptions, the operations of the respective parts that constitute the substrate processing apparatus are controlled by the controller 121.

In the film-forming sequence shown in FIG. 4, there are performed:

a step of providing a wafer 200 that includes a surface exposing a first film containing Si, O, C and N and having an O atom concentration higher than a Si atom concentration, which is higher than a C atom concentration, which is equal to or higher than an N atom concentration, i.e., a SiOCN film having a composition of O atom concentration>Si atom concentration>C atom concentration≥N atom concentration; and a step of changing a composition of a surface of the first film so that the N atom concentration becomes higher than the C atom concentration on the surface of the first film, by supplying a plasma-excited N-containing gas ($N_2^*$) to the surface of the first film.

In the step of providing the wafer 200 that includes the surface exposing the first film, the first film is formed on the wafer 200 by performing a cycle a predetermined number of times (n times where n is an integer of 1 or more), the cycle including non-simultaneously performing:

step 1 of supplying a HCDS gas as a precursor gas (Si-containing gas) to the wafer 200;

step 2 of supplying a TEA gas as a first reaction gas (a gas containing N and C) to the wafer 200: and step 3 of supplying an $O_2$ gas as a second reaction gas (O-containing gas) to the wafer 200.

In the step of changing the composition of the surface of the first film, a second film containing Si, O, C and N and having an O atom concentration higher than a Si atom concentration, which is higher than an N atom concentration higher than a C atom concentration, i.e., an N-rich SiOCN film having a composition of O atom concentration>Si atom concentration>N atom concentration>C atom concentration, is formed on the surface of the exposed first film.

In this present disclosure, for the sake of convenience, the film-forming sequence shown in FIG. 4 may be denoted as follows. The same denotation will also be used in the explanation of modifications to be described later.

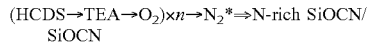

(HCDS→TEA→$O_2$)×n→$N_2^*$⇒N-rich SiOCN/SiOCN

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the language "a predetermined layer is formed on a wafer" as used herein may mean that "a predetermined layer is directly formed on a surface of a wafer itself" or that "a predetermined layer is formed on a layer or the like formed on a wafer." In addition, when the term "substrate" is used herein, it may be synonymous with the term "wafer."

(Wafer Charging and Boat Loading)

When a plurality of wafers 200 is charged on the boat 217 (wafer charging), the shutter 219s is moved by the shutter opening/closing mechanism 115s to open the lower end opening of the manifold 209 (shutter open). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 exist, is vacuum-evacuated (de-pressurization-evacuated) by the vacuum pump 246 so as to reach a desired pressure (degree of vacuum). At this time, the pressure in the process chamber 201 is measured by the pressure sensor 245. The APC valve 244 is feedback-controlled based on the measured pressure information. Further, the wafers 200 in the process chamber 201 are heated by the heater 207 to a desired process temperature. At this time, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 is started. The operation of the vacuum pump 246 and the heating and rotation of the wafers 200 may be continuously performed at least until the processing of the wafers 200 is completed.

(First Film Forming Step)

Then, the following steps 1 to 3 are executed sequentially.

[Step 1]

In this step, an HCDS gas is supplied to the wafer 200 in the process chamber 201.

Specifically, the valve 243a is opened to allow the HCDS gas to flow into the gas supply pipe 232a. The flow rate of the HCDS gas is adjusted by the MFC 241a. The HCDS gas is supplied into the process chamber 201 via the nozzle 249a and is exhausted from the exhaust pipe 231. At this time, the HCDS gas is supplied to the wafer 200. In this case, the valves 243d to 243f may be opened to allow an $N_2$ gas to flow into the gas supply pipes 232d to 232f. The flow rate of the $N_2$ gas may be adjusted by the MFCs 241d to 241f. The $N_2$ gas is supplied into the process chamber 201 via the nozzles 249a to 249c and the buffer chamber 237.

An example of the processing conditions in this step is as follows.

HCDS gas supply flow rate: 1 to 2000 sccm (10 to 1000 sccm in some embodiments)

$N_2$ gas supply flow rate (per gas supply pipe): 0 to 10000 sccm

Each gas supply time: 1 to 120 seconds (1 to 60 seconds in some embodiments)

Process temperature: 250 to 800 degrees C. (400 to 700 degrees C. in some embodiments)

Process pressure: 1 to 2666 Pa (67 to 1333 Pa in some embodiments)

By supplying the HCDS gas to the wafer 200 under the above-mentioned conditions, a Si-containing layer containing Cl is formed as a first layer on the outermost surface of the wafer 200. The Si-containing layer containing Cl is formed as HCDS is physically adsorbed on the outermost surface of the wafer 200, as a substance (hereinafter referred to as "$Si_xCl_y$") generated by decomposition of a part of HCDS is chemically adsorbed on the outermost surface of the wafer 200, or as HCDS is thermally decomposed on the outermost surface of the wafer 200. The Si-containing layer containing Cl may be an adsorption layer (a physical adsorption layer or a chemical adsorption layer) of HCDS or $Si_xCl_y$, or may be a Si layer containing Cl. In the present disclosure, the Si-containing layer containing Cl is also simply referred to as a Si-containing layer.

After the first layer is formed on the wafer 200, the valve 243a is closed to stop the supply of the HCDS gas into the process chamber 201. Then, the inside of the process chamber 201 is evacuated into vacuum, and the gas and the like remaining in the process chamber 201 are removed from the process chamber 201. At this time, the valves 243d to 243f are opened to supply the $N_2$ gas into the process chamber 201. The $N_2$ gas acts as a purge gas.

As the precursor gas (Si-containing gas), in addition to the HCDS gas, it may be possible to use chlorosilane gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, and the like. Furthermore, as the precursor gas, it may be possible to use a tetrafluorosilane ($SiF_4$) gas, a tetrabromosilane ($SiBr_4$) gas, a tetraiodosilane ($SiI_4$) gas, and the like. That is, as the precursor gas, it may be possible to use various halosilane gases such as to chlorosilane gas, a fluorosilane gas, a bromosilane gas, an iodosilane gas, and the like.

Furthermore, as the precursor gas (Si-containing gas), it may be possible to use various aminosilane gases such as bis(diethylamino) silane ($SiH_2[N(C_2H_5)_2]_2$, abbreviation: BDEAS) gas, a bis(tertiary-butylamino)silane ($SiH_2[NH(C_4H_9)]_2$, abbreviation: BTBAS) gas, a tris(diethylamino) silane ($SiH[N(C_2H_5)_2]_3$, abbreviation: 3DEAS) gas, a tris(dimethylamino)silane ($SiH[N(CH_3)_2]_3$, abbreviation: 3DMAS) gas, a tetrakis(diethylamino)silane ($Si[N(C_2H_5)_2]_4$, abbreviation: 4DEAS) gas, a tetrakis(dimethylamino)silane ($Si[N(CH_3)_2]_4$, abbreviation: 4DMAS) gas, and the like.

As the purge gas, in addition to the $N_2$ gas, it may be possible to use, for example, various rare gases such as an Ar gas, a He gas, a Ne gas, a Xe gas, and the like. This is also the case in steps 2 and 3 and a second film forming step which will be described later.

[Step 2]

After step 1 is completed, a TEA gas is supplied to the wafer 200 in the process chamber 201, i.e., the first layer formed on the wafer 200.

Specifically, the opening/closing control of the valves 243b and 243d to 243f is performed in the same manner as the opening/closing control of the valves 243a and 243d to 243f in step 1. The flow rate of the TEA gas is adjusted by the MFC 241b. The TEA gas is supplied into the process chamber 201 via the nozzle 249b and is exhausted from the exhaust pipe 231. At this time, the TEA gas is supplied to the wafer 200.

An example of the processing conditions in this step is as follows.

TEA gas supply flow rate: 1 to 2000 sccm (10 to 1000 sccm in some embodiments)
Process pressure: 1 to 4000 Pa (1 to 3000 Pa in some embodiments)

Other processing conditions are the same as the processing conditions in step 1.

By supplying the TEA gas to the wafer 200 under the above-described conditions, it is possible to allow the first layer formed on the wafer 200 in step 1 to react with the TEA gas. As a result, it is possible to desorb Cl from the first layer and to incorporate an N component and a C component contained in the TEA gas into the first layer. By modifying the first layer in this manner, a layer containing Si, C and N, i.e., a silicon carbonitride layer (SiCN layer) is formed as a second layer on the wafer 200.

After forming the second layer on the wafer 200, the valve 243b is closed to stop the supply of the TEA gas into the process chamber 201. Then, the gas and the like remaining in the process chamber 201 are removed from the inside of the process chamber 201 by the same processing procedure as in step 1.

As the first reaction gas (gas containing N and C), in addition to the TEA gas, it may be possible to use an ethylamine-based gas such as a diethylamine ($(C_2H_5)_2NH$, abbreviation: DEA) gas, a monoethylamine ($C_2H_5NH_2$, abbreviation: MEA) gas or the like, a methylamine-based gas such as a trimethylamine ($(CH_3)_3N$, abbreviation: TMA) gas, a dimethylamine ($(CH_3)_2NH$, abbreviation: DMA) gas, a monomethylamine ($CH_3NH_2$, abbreviation: MMA) or the like, a propylamine-based gas such as a tripropylamine ($(C_3H_7)_3N$, abbreviation: TPA) gas, a dipropylamine ($(C_3H_7)_2NH$, abbreviation: DPA) gas, a monopropylamine ($C_3H_7NH_2$, abbreviation: MPA) or the like, an isopropylamine-based gas such as a triisopropylamine ($[(CH_3)_2CH]_3N$, abbreviation: TIPA) gas, a diisopropylamine ($[(CH_3)_2CH]_2NH$, abbreviation: DIPA) gas, a monoisopropylamine ($(CH_3)_2CHNH_2$, abbreviation: MIPA) gas or the like, a butylamine-based gas such as a tributylamine ($(C_4H_9)_3N$, abbreviation: TBA) gas, a dibutylamine ($(C_4H_9)_2NH$, abbreviation: DBA) gas, a monobutylamine ($C_4H_9NH_2$, abbreviation: MBA) or the like, and an isobutylamine-based gas such as a triisobutylamine ($[(CH_3)_2CHCH_2]_3N$, abbreviation: TIBA) gas, a diisobutylamine ($[(CH_3)_2CHCH_2]_2NH$, abbreviation: DIBA) gas, a monoisobutylamine ($(CH_3)_2CHCH_2NH_2$, abbreviation: MIBA) gas or the like.

As the first reaction gas (gas containing N and C), in addition to the amine-based gas, it may be possible to use an organic hydrazine-based gas. As the organic hydrazine-based gas, it may be possible to use a methyl hydrazine-based gas such as a monomethyl hydrazine ($(CH_3)HN_2H_2$, abbreviation: MMH) gas, a dimethyl hydrazine ($(CH_3)_2N_2H_2$, abbreviation: DMH) gas, a trimethyl hydrazine ($(CH_3)_2N_2(CH_3)H$, abbreviation: TMH) gas or the like, and an ethyl hydrazine-based gas such as ethyl hydrazine ($(C_2H_5)HN_2H_2$, abbreviation: EH) gas or the like.

[Step 3]

After step 2 is completed, an $O_2$ gas is supplied to the wafer 200 in the process chamber 201, i.e., the second layer formed on the wafer 200.

Specifically, the opening/closing control of the valves 243c to 243f is performed in the same manner as the opening/closing control of the valves 243a and 243d to 243f in step 1. The flow rate of the $O_2$ gas is adjusted by the MFC 241c. The $O_2$ gas is supplied into the process chamber 201 via the nozzle 249c and the buffer chamber 237, and is exhausted from the exhaust pipe 231. At this time, the $O_2$ gas is supplied to the wafer 200.

An example of the processing conditions in this step is as follows.

$O_2$ gas supply flow rate: 100 to 10000 sccm
Process pressure: 1 to 4000 Pa (1 to 3000 Pa in some embodiments)

Other processing conditions are the same as the processing conditions in step 1.

By supplying the $O_2$ gas to the wafer 200 under the above-mentioned conditions, it is possible to oxidize at least a part of the second layer formed on the wafer 200 in step 2. As a result, Cl can be desorbed from the second layer and an O component contained in the $O_2$ gas may be taken into the second layer. As the second layer is oxidized, a layer containing Si, O, C and N, i.e., a silicon oxycarbonitride layer (SiOCN layer) is formed as a third layer on the wafer 200. The third layer is a layer having a composition of O atom concentration>Si atom concentration>C atom concentration≥N atom concentration.

After forming the third layer on the wafer 200, the valve 243c is closed to stop the supply of the $O_2$ gas into the process chamber 201. Then, the gas and the like remaining in the process chamber 201 are removed from the inside of the process chamber 201 by the same processing procedure as in step 1.

As the second reaction gas (O-containing gas), in addition to the $O_2$ gas, it may be possible to use a nitrous oxide ($N_2O$) gas, a nitrogen monoxide (NO) gas, a nitrogen dioxide ($NO_2$) gas, an ozone ($O_3$) gas, a water vapor ($H_2O$ gas), a carbon monoxide (CO) gas, a carbon dioxide ($CO_2$) gas and the like.

[Performing a Predetermined Number of Times]

A SiOCN film having a desired composition and a desired film thickness can be formed as a first film on the wafer 200 by performing, one or more times (n times) a cycle in which steps 1 to 3 are performed non-simultaneously, i.e., without synchronization. FIG. 5A is an enlarged sectional view of the surface of the wafer 200 showing a state after forming the first film on the wafer 200. The first film is a film having a composition of O atom concentration>Si atom concentration>C atom concentration≥N atom concentration. The cycle described above may be repeated a plurality of times in some embodiments. That is, the thickness of the third layer formed per cycle may be set smaller than a desired film thickness, and the cycle described above may be repeated a plurality of times until the film thickness of the first film formed by laminating the third layer becomes the desired film thickness, in some embodiments.

(Second Film Forming Step)

After providing the wafer 200 with the first film exposed on the surface thereof is completed by performing the first film forming step, a plasma-excited $N_2$ gas ($N_2$*) is supplied to the wafer 200 in the process chamber 201, i.e., the exposed surface of the first film formed on the wafer 200.

Specifically, while applying RF power between the rod-shaped electrodes 269 and 270, the valve 243f is opened to allow the $N_2$ gas to flow into the gas supply pipe 232f. The flow rate of the $N_2$ gas is adjusted by the MFC 241f. The $N_2$ gas is supplied into the process chamber 201 via the nozzle 249c and the buffer chamber 237 and is exhausted from the exhaust pipe 231. The $N_2$ gas is excited (activated) by plasma when passing through the buffer chamber 237. At this time, active species such as $N_2$* and the like are generated and are supplied to the wafer 200. That is, the plasma-excited $N_2$ gas contains active species such as $N_2$* and the like. In the present disclosure, for the sake of convenience, the plasma-excited $N_2$ gas is also referred to as $N_2$*. At this time, the valves 243d and 243e may be opened so that the $N_2$ gas flows into the gas supply pipes 232d and 232e.

An example of the processing conditions in this step is as follows.

Plasma-excited $N_2$ gas supply flow rate: 100 to 5000 sccm
RF power: 1 to 1500 W (1 to 1000 W in some embodiments)
$N_2$* Supply time: 10 to 1200 seconds
Process temperature: 100 to 700 degrees C.
Process pressure: 0.5 to 100 Pa (0.5 to 10 Pa in some embodiments)

Other processing conditions are the same as the processing conditions in step 1.

By supplying $N_2$* to the wafer 200 under the above-mentioned conditions, it is possible to modify (nitride) the surface of the first film formed on the wafer 200 in the first film forming step and to change the composition thereof. Thus, a film containing Si, O, C and N and having a relatively high N atom concentration, i.e., an N-rich SiOCN film, can be formed as a second film on the surface of the first film. FIG. 5B is an enlarged sectional view of the surface of the wafer 200 showing a state after the second film is formed on the surface of the first film. The N atom concentration in the second film increases due to the influence of the above-mentioned modifying reaction and becomes higher than the N atom concentration in the first film. The C atom concentration in the second film decreases due to the influence of the above-mentioned modifying reaction and becomes lower than the C atom concentration in the first film. As a result, the second film is a film having a composition of O atom concentration>Si atom concentration>N atom concentration>C atom concentration.

Under the above-mentioned conditions, the modifying process of the first film proceeds uniformly over the entire surface of the first film. The modifying process of the first film hardly proceeds or does not proceed at all in the region below the surface of the first film. As a result, the second film can be formed into a continuous film covering the entire exposed surface (the entire surface) of the first film, and the film thickness of the second film can be set to a thickness falling within a range of, for example, 4 to 5 nm (40 to 50 Å). If the film thickness of the second film is less than 4 nm, the below-described blocking effect by the second film may not be obtained in some cases. By setting the film thickness of the second film to 4 nm or more, the blocking effect of the second film can be obtained, and the oxidation resistance (ashing resistance) and the dry etching resistance of the finally-formed SiOCN film (the first film with the second film formed on the surface thereof) can be enhanced. In addition, if the film thickness of the second film exceeds 5 nm, the dielectric constant of the entire finally-formed SiOCN film may become high in some cases. By setting the film thickness of the second film to 5 nm or less, it is possible to suppress an increase in the dielectric constant of the entire finally-formed SiOCN film and to maintain this film as a low-dielectric constant film (low-k film).

The reason why the modifying process of the first film can be progressed only on the surface of the first film (for example, in a region within a range of 40 to 50 Å from the surface) is that in the second film forming step, the $N_2$ gas is plasma-excited and supplied to the wafer 200 on which the first film is formd, i.e., the first film is plasma-nitrided by using active species such as $N_2$* or the like. For example, when an $NH_3$ gas is thermally excited and supplied to the wafer 200 on which the first film is formed, i.e., when the first film is thermally nitrided in a non-plasma atmosphere, not only the surface of the first film but also the region below the surface of the first film may be nitrided. Thus, it is difficult to nitride only the surface of the first film. In this case, an increase in the dielectric constant and a reduction in the wet etching resistance of the entire finally-formed SiOCN film may occur. Incidentally, in the case of performing plasma nitriding, unlike the case of performing thermal nitriding, it is unnecessary to greatly increase or decrease the temperature inside the process chamber 201. It is therefore possible to improve the productivity in the entire film-forming process.

After modifying the surface of the first film to form a second film on the surface of the first film, the application of RF power between the rod-shaped electrodes 269 and 270 is stopped, and the supply of $N_2^*$ into the process chamber 201 is stopped. Then, the gas and the like remaining in the process chamber 201 are removed from the inside of the process chamber 201 by the same processing procedure as in step 1.

(After-Purging and Atmospheric Pressure Restoration)

After the second film forming step is completed, an $N_2$ gas as a purge gas is supplied from each of the gas supply pipes 232d to 232f into the process chamber 201 and is exhausted from the exhaust pipe 231. As a result, the interior of the process chamber 201 is purged, and the gas and the reaction byproduct remaining in the process chamber 201 are removed from the process chamber 201 (after-purging). Thereafter, the atmosphere in the process chamber 201 is replaced by an inert gas (inert gas replacement), and the pressure in the process chamber 201 is restored to the atmospheric pressure (atmospheric pressure restoration).

(Boat Unloading and Wafer Discharging)

The seal cap 219 is lowered by the boat elevator 115, and the lower end of the manifold 209 is opened. Then, the processed wafers 200 are unloaded from the lower end of the manifold 209 to the outside of the reaction tube 203 in a state in which the processed wafers 200 are supported by the boat 217 (boat unloading). After the boat unloading, the shutter 219s is moved so that the lower end opening of the manifold 209 is sealed by the shutter 219s via the O ring 220c (shutter closing). The processed wafers 200 are taken out to the outside of the reaction tube 203 and then discharged from the boat 217 (wafer discharging).

(3) Effects According to the Present Embodiment

According to the above-described embodiment, one or more effects described below may be achieved.

(a) By forming the first film as a film having a composition of O atom concentration>Si atom concentration>C atom concentration≥N atom concentration, and by forming the second film as a film having a composition of O atom concentration>Si atom concentration>N atom concentration>C atom concentration, it becomes possible to form the finally-formed SiOCN film (the first film with the second film formed on the surface thereof) as a low-k film having a low dielectric constant. The reason why the finally-formed SiOCN film has such excellent properties is that each of the first film and the second film has a composition of O atom concentration>Si atom concentration, i.e., contains O atoms at a high concentration.

(b) By allowing each of the first film and the second film to have the above-mentioned composition, it is possible to form the finally-formed SiOCN film as a film having a high resistance to an etching solution such as an aqueous solution of hydrogen fluoride (HF), i.e., a film excellent in wet etching resistance. The reason why the finally-formed SiOCN film has such excellent properties is that each of the first film and the second film contains C atoms at a predetermined concentration. In particular, in the present embodiment, the first film which occupies the most part of the finally-formed SiOCN film has a composition of C atom concentration≥N atom concentration. Therefore, it is easy to increase the wet etching resistance of the film.

(c) By allowing the second film to have the above-mentioned composition, it becomes possible to enhance the ashing resistance and the dry etching resistance of the finally-formed SiOCN film. This is because when oxygen plasma or the like is supplied to the wafer 200 subjected to the second film forming step, the second film having the composition of N atom concentration>C atom concentration acts to prevent the oxidizing species contained in oxygen plasma from reaching the first film. Further, this is because when an etching gas such as a $CF_4$ gas or the like is supplied to the wafer 200 subjected to the second film forming step, the second film having the composition of N atom concentration>C atom concentration acts to prevent the reaction species contained in the etching gas from reaching the first film. These effects (first film protection effects) obtained by the second film are also referred to as a blocking effect in the present disclosure.

(d) By forming the second film as a continuous film having a film thickness of, for example, 4 nm or more, it is possible to reliably obtain the above-mentioned blocking effect. This makes it possible to reliably improve the ashing resistance and the dry etching resistance of the finally-formed SiOCN film.

(e) By suppressing the film thickness of the second film to, for example, a film thickness of 5 nm or less, it is possible to suppress an increase in the dielectric constant of the entire finally-formed SiOCN and to maintain this film as a low-k film. It is also possible to suppress a reduction in the wet etching resistance of the entire finally-formed SiOCN film.

(f) As described above, in the present embodiment, the SiOCN film formed on the wafer 200 can be formed as a high-quality film having a low dielectric constant and excellent processing resistances such as a wet etching resistance, an ashing resistance, a dry etching resistance and the like. The SiOCN film of the present embodiment having the low dielectric constant and the processing resistances in a balanced manner may be used as an insulating film, an interlayer film, a mask film, a charge storage film, a stress control film, a gate spacer film and the like.

(g) In the second film forming step, the first film is plasma-nitrided. Therefore, it is possible to nitride only the surface of the first film. In addition, it is unnecessary to raise and lower the temperature in the process chamber 201. It is also possible to improve the productivity in the entire film forming process.

(h) The above-described effects can be similarly obtained when a Si-containing gas other than the HCDS gas is used as the precursor gas, when a gas containing N and C other than the TEA gas is used as the first reaction gas, or when an O-containing gas other than the $O_2$ gas is used as the second reaction gas.

(4) Modifications

The present embodiment may be modified as in the following modifications. Further, these modifications may be arbitrarily combined.

(Modification 1)

As shown in the film-forming sequence below, in the second film forming step, instead of plasma-exciting and supplying the $N_2$ gas alone, for example, an $H_2$ gas as an H-containing gas may be added to the $N_2$ gas, and a mixed gas of the $H_2$ gas and the $N_2$ gas may be plasma-excited and supplied. That is, a plasma-excited $N_2$ gas ($N_2^*$) and a plasma-excited $H_2$ gas ($H_2^*$) may be supplied together to the first film formed on the wafer 200. As the H-containing gas, in addition to the $H_2$ gas, it may be possible to use a deuterium ($D_2$) gas, and the flow rate thereof may be set to a flow rate in the range of, for example, 100 to 5000 sccm.

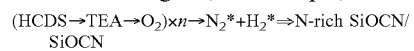

Also in this modification, it becomes possible to form a second film having a composition of O atom concentration>Si atom concentration>N atom concentration>C atom concentration on the surface of the first film, and it is possible to obtain the same effects as those of the film-forming sequence shown in FIG. 4. Further, when forming the second film, the metal contamination of the wafer 200 or the film formed thereon can be reduced or eliminated by supplying $H_2^*$ and $N_2^*$ to the wafer 200.

(Modification 2)

As shown in the film-forming sequence below, in the second film forming step, instead of plasma-exciting and supplying the $N_2$ gas alone, for example, an Ar gas as a rare gas may be added to the $N_2$ gas, and a mixed gas of the Ar gas and the $N_2$ gas may be plasma-excited and supplied to the wafer 200. That is, a plasma-excited $N_2$ gas ($N_2^*$) and a plasma-excited Ar gas (Ar*) may be supplied together to the first film formed on the wafer 200. As the rare gas, in addition to the Ar gas, it may be possible to use a He gas, a Ne gas, a Xe gas or the like, and the flow rate thereof may be set to a flow rate in the range of, for example, 100 to 5000 sccm.

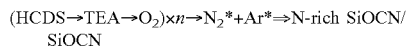
(HCDS→TEA→$O_2$)×n→$N_2^*$+Ar*⇒N-rich SiOCN/SiOCN

Also in this modification, it becomes possible to form a second film having a composition of O atom concentration>Si atom concentration>N atom concentration>C atom concentration on the surface of the first film, and it is possible to obtain the same effects as those of the film-forming sequence shown in FIG. 4. Further, in the second film forming step, it is also possible to finely adjust the composition of the second film by adding the Ar gas to the $N_2$ gas. For example, by increasing the ratio of the flow rate of the Ar gas to the flow rate of the $N_2$ gas (Ar gas/$N_2$ gas), it is possible to control the amount of N atoms contained in the second film in a decreasing direction. Further, for example, by reducing the ratio of the flow rate of the Ar gas to the flow rate of the $N_2$ gas (Ar gas/$N_2$ gas), it is possible to control the amount of N atoms contained in the second film in an increasing direction.

Other Embodiments

The embodiment of the present disclosure has been specifically described above. However, the present disclosure is not limited to the embodiment described above, and various changes may be made without departing from the spirit of the present disclosure.

In the above-described embodiment, the example in which the first film forming step and the second film forming step are performed in the same process chamber 201 (in-situ) has been described. However, the present disclosure is not limited to such an embodiment. That is, the first film forming step and the second film forming step may be performed in different process chambers (ex-situ). If the series of steps are performed in-situ, the wafers 200 are not exposed to the atmosphere during the process, the wafers 200 can be processed consistently while keeping the wafers 200 under a clean atmosphere, and a stable film forming process can be performed. If the respective steps are performed ex-situ, the temperature in each process chamber can be set in advance to, for example, the process temperature at each step or a temperature close thereto, and the time required for changing the temperature in the process chamber can be reduced and the production efficiency can be enhanced. In this case, since the temperature in each process chamber is not changed, it is possible to avoid adverse influence due to the peeling of the film deposited inside the process chamber.

Figure 6:
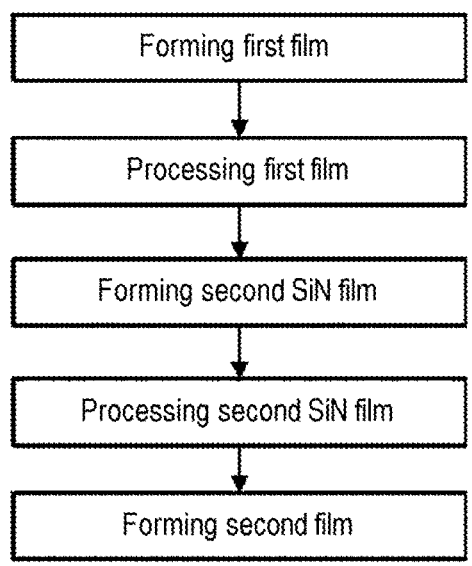
FIG. 6 is a flow chart of substrate processing in the case where a first film-forming step and a second film-forming step are performed ex-situ.

In the case where the first film forming step and the second film forming step are performed ex-situ, for example, after the formation of the first film, a part of the first film may be exposed through a processing step including formation and etching of another film, and the surface thereof may be plasma-nitrided in this state. FIG. 6 is a flowchart of substrate processing illustrating a case where the first film forming step and the second film forming step are performed ex-situ.

In the flow chart shown in FIG. 6, after a wafer having a laminated structure formed of an SiO film, a high-k film, a metal film and a nitride film (first SiN film) formed on its surface is carried into a first process chamber, a first film (SiOCN film) having a composition of O atom concentration>Si atom concentration>C atomic concentration≥N atom concentration is formed on the wafer under the same processing procedure and processing conditions as in the first film forming step of the above-described embodiment (first film forming step).

Thereafter, the wafer subjected to the formation of the first film is carried out from the inside of the first process chamber, and the first film is processed by performing a photolithography process, an etching process and the like on the wafer (first film processing step).

Thereafter, a nitride film (second SiN film) as a film different from the first film is formed on the wafer subjected to the processing the first film, using a well-known film-forming technique such as a CVD method or the like (second SiN film forming step).

Then, by performing a photolithography process, an etching process and the like again on the wafer on which the second SiN film is formed, the second SiN film is processed (a part of the second SiN film is removed), thereby exposing the surface of the first film on the surface of the wafer again (second SiN film processing step).

Figure 7A:
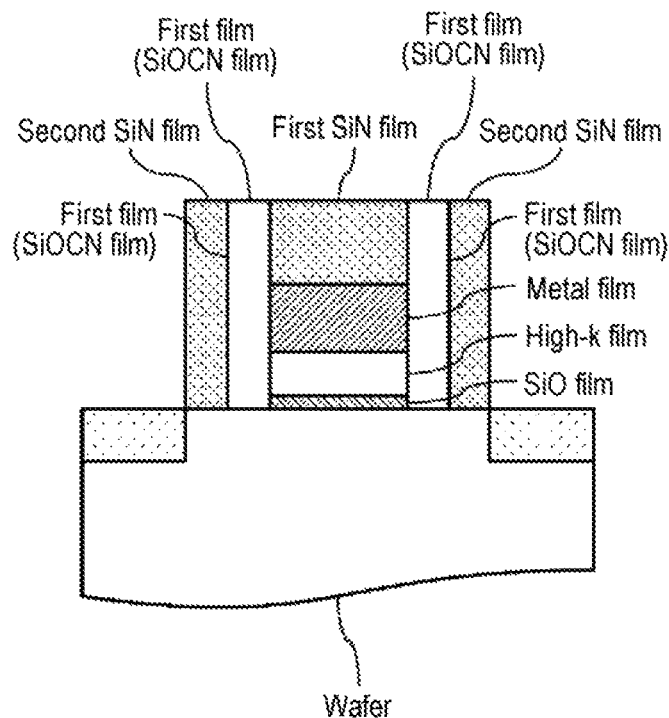
FIG. 7A is an enlarged sectional view of a surface of a substrate showing a state in which a part of a first film formed on a substrate is exposed.

FIG. 7A shows a sectional structure of the surface of the wafer after the processing of the second SiN film is completed. As shown in FIG. 7A, on the surface of the wafer, the first film, the second SiN film and the first SiN film are exposed in an adjacent (contact) manner. Further, the unexposed portion of the first film is covered with the second SiN film, the first SiN film or the like in a state in which the unexposed portion of the first film makes contact with the second SiN film, the first SiN film or the like.

Thereafter, the wafer is carried into a second process chamber different from the first process chamber, the composition of the exposed surface of the first film is changed under the same processing procedure and processing conditions as in the second film forming step of the above-described embodiment, and a second film (N-rich SiOCN film) having a composition of O atom concentration>Si atom concentration>N atom concentration>C atom concentration is formed on the exposed surface (second film forming step).

Figure 7B:
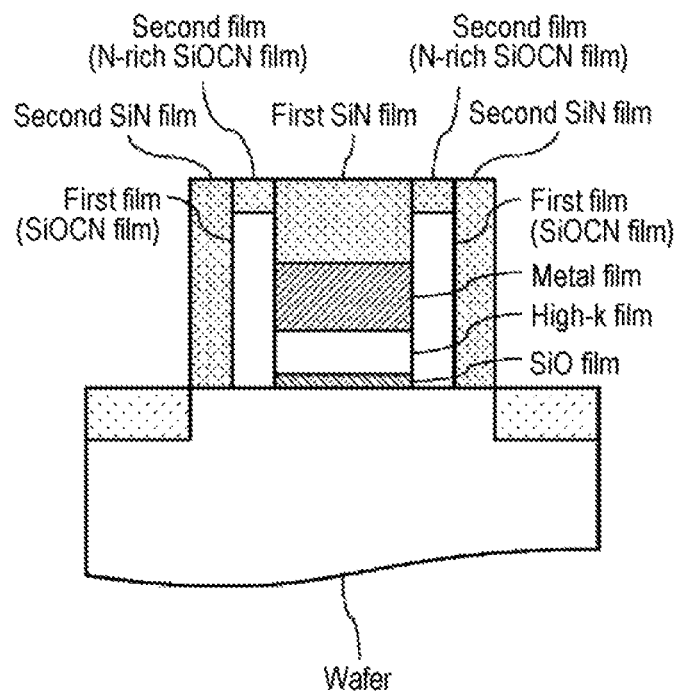
FIG. 7B is an enlarged sectional view of a surface of a substrate showing a state in which a second film is formed by changing the composition of the surface of the exposed first film.

FIG. 7B shows a sectional structure of the surface of the wafer after the second film forming step is completed. As shown in FIG. 7B, the exposed surface of the first film is changed to a second film (N-rich SiOCN film). This makes it possible to improve the ashing resistance and the dry etching resistance of the finally-formed SiOCN film (the first film with the second film formed on the surface thereof) and to bring the ashing resistance and the dry etching resistance of the finally-formed SiOCN close to those of the first SiN film or the second SiN film adjacent to the finally-formed SiOCN film. Under the processing conditions described above, it is possible to change only the composition of the surface of the exposed first film, with little or no nitriding of the region below the surface of the first film. This makes it possible to suppress an increase in the dielectric constant and a decrease in the wet etching resistance of the entire finally-formed SiOCN film. In addition, under the above-described processing conditions, only the composition of the surface of the exposed first film can be changed without changing the composition of the surface of the first SiN film or the second SiN film, i.e., the nitride film adjacent to the first film. That is, it is possible to avoid a change in the properties of the first SiN film or the second SiN film adjacent to the SiOCN film.

In this case, the steps from the first film forming step to the second SiN film processing step include a step of providing the wafer with the first film exposed on the surface thereof. The step of carrying (accommodating) the wafer with the first film exposed on the surface thereof into the second process chamber may be included in the step of providing the wafer with the first film exposed on the surface thereof.

In some embodiments, the recipes used for substrate processing may be individually prepared according to the processing contents and stored in the memory device 121c via the electric communication line or the external memory device 123. When starting the substrate processing, the CPU 121a may select an appropriate recipe from the plurality of recipes stored in the memory device 121c according to the substrate processing contents in some embodiments. This makes it possible to form films of various film types, composition ratios, film qualities and film thicknesses with high reproducibility in one substrate processing apparatus. It is also possible to reduce the burden on an operator and to quickly start the process while avoiding operation errors.

The above-described recipes are not limited to the case of newly creating them, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, by operating the input/output device 122 installed in the existing substrate processing apparatus, the existing recipes already installed in the substrate processing apparatus may be directly changed.

In the above-described embodiment, there has been described an example where a film is formed using a batch type substrate processing apparatus that processes a plurality of substrates at a time. The present disclosure is not limited to the above-described embodiments, but may be suitably applied to, for example, a case where a film is formed using a single-wafer type substrate processing apparatus that processes one or several substrates at a time. Furthermore, in the above-described embodiment, there has been described an example where a film is formed using a substrate processing apparatus including a hot wall type process furnace. The present disclosure is not limited to the above-described embodiment, but may be suitably applied to a case where a film is formed using a substrate processing apparatus including a cold wall type process furnace.

Even in the case of using these substrate processing apparatuses, film formation can be performed under the same processing procedure and processing conditions as those of the above-described embodiment and modifications, and the same effects as those of the above-described embodiment and modifications can be obtained.

Further, the above-described embodiment and modifications may be used in combination as appropriate. The processing procedures and processing conditions at this time may be the same as, for example, the processing procedures and processing conditions of the above-described embodiment.

Example

Hereinafter, Examples will be described.

As an Example, using the substrate processing apparatus shown in FIG. 1, a SiOCN film (a first film with a second film formed on its surface) was formed on a wafer according to the film-forming sequence shown in FIG. 4. The processing conditions were predetermined conditions within a range of the processing condition range described in the above embodiment. The film thickness of the SiOCN film falls within the range of 150 to 200 Å.

As a Comparative Example, using the substrate processing apparatus shown in FIG. 1, a SiOCN film was formed on a wafer by the same film-forming sequence as that of the above-described first film forming step. In the Comparative Example, the modifying process for supplying $N_2^*$ to the surface of the SiOCN film, i.e., the second film forming step was not performed. The processing conditions at the time of forming the SiOCN film are the same as those of the first film forming step of the Example. The film thickness of the SiOCN film was set to be the same as the film thickness of the SiOCN film of the Example.

Figure 8A:
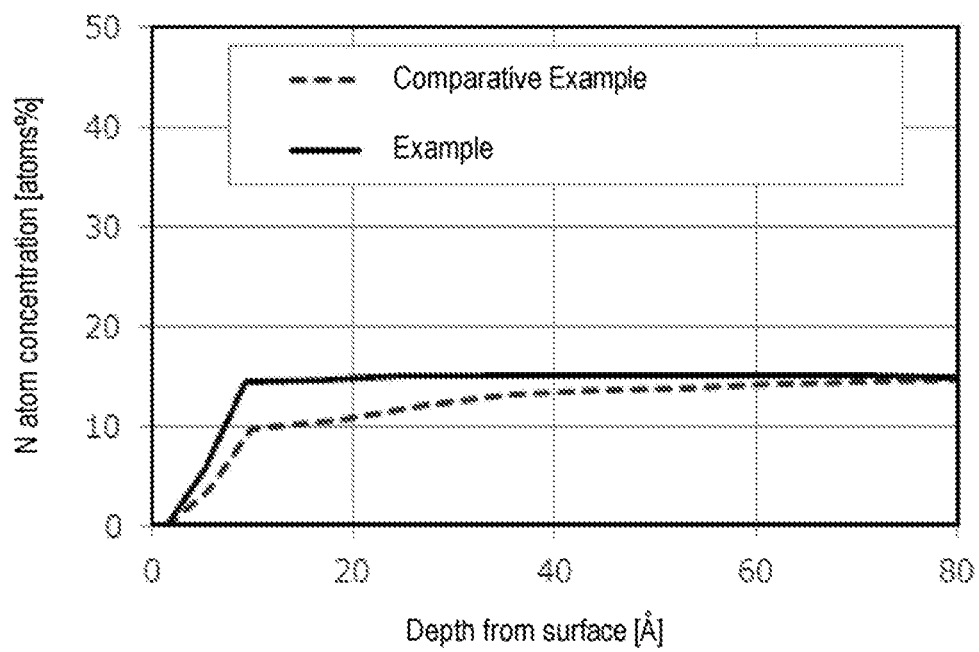
FIG. 8A is a view showing the measurement results of a film composition.

The composition of each of the SiOCN films of the Example and the Comparative Example was measured by the Rutherford backscattering analysis method (RBS method). FIG. 8A shows the measurement results. In FIG. 8A, the vertical axis represents the N atom concentration (atoms %) in the SiOCN film, and the horizontal axis represents the depth (Å) from the surface of the SiOCN film. In FIG. 8A, the solid line indicates the Example and the broken line indicates the Comparative Example.

According to FIG. 8A, it can be seen that the N atom concentration on the surface of the SiOCN film of the Example is higher than that of the SiOCN film of the Comparative Example. In addition, it can be noted that in the region excluding the surface of the film (for example, the region on the side of a middle layer and a lower layer of the film), the N atom concentration of the SiOCN film of the Example is almost equal to the N atom concentration of the SiOCN film of the Comparative Example. That is, it can be seen that it is possible to form an N-rich second film on the surface of the first film by supplying $N_2^*$ to the surface of the first film under the above-mentioned conditions after forming the first film. It can also be seen that in the region excluding the surface of the SiOCN film (the region on the side of a middle layer and a lower layer of the film), it is possible to keep the composition of the film unchanged. In FIG. 8A, the N atom concentration in the extreme vicinity of the surface (at the depth of 10 Å or less from the surface) appears to sharply decrease due to the measurement limit of a measuring instrument or due to the influence of a natural oxide film formed on the surface of the film or an organic substance adhering to the surface of the film.

An ashing process of supplying $O_2$ plasma to each of the SiOCN films of the Example and the Comparative Example and a wet etching process of supplying an aqueous solution of HF of 1% concentration to each of the SiOCN films subjected to the ashing process were sequentially performed.

Figure 8B:
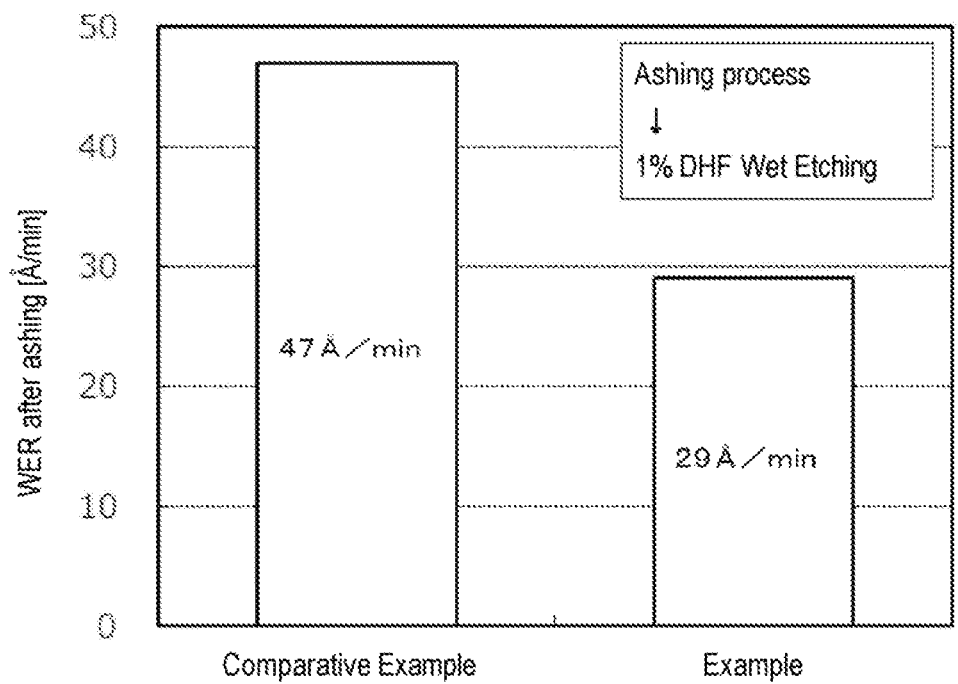
FIG. 8B is a view showing evaluation results of a wet etching resistance of a film subjected to an ashing process.

The ashing resistance of the film, i.e., the HF resistance after the ashing process was evaluated. FIG. 8B shows the evaluation results of the wet etching rate (WER) of each of the SiOCN films of the Example and the Comparative Example after the ashing process. In FIG. 8B, the horizontal axis represents the Comparative Example and the Example, and the vertical axis represents the WER [Å/min] after the ashing process.

According to FIG. 8B, it can be noted that the WER after the ashing process is smaller in the SiOCN film of the Example than in the SiOCN film of the Comparative Example. That is, it can be seen that by changing the composition of the surface of the first film to form the N-rich second film after forming the first film, it is possible to improve the ashing resistance of the finally-formed SiOCN film, i.e., the HF resistance after the ashing process.

According to the present disclosure in some embodiments, it is possible to improve the properties of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    providing a substrate that comprises a surface exposing a first film containing silicon, oxygen, carbon and nitrogen and having an oxygen atom concentration higher than a silicon atom concentration, which is higher than a carbon atom concentration, which is equal to or higher than a nitrogen atom concentration; and
    changing a composition of a surface of the first film so that the nitrogen atom concentration becomes higher than the carbon atom concentration on the surface of the first film, by supplying a plasma-excited nitrogen-containing gas to the surface of the first film,
    wherein in the act of changing the composition of the surface of the first film, a second film containing silicon, oxygen, carbon and nitrogen and having an oxygen atom concentration higher than a silicon atom concentration, which is higher than a nitrogen atom concentration, which is higher than a carbon atom concentration, is formed on the surface of the first film.

2. The method of claim 1, wherein the nitrogen atom concentration in the second film is higher than the nitrogen atom concentration in the first film.

3. The method of claim 1, wherein the carbon atom concentration in the first film is higher than the carbon atom concentration in the second film.

4. The method of claim 1, wherein in the act of changing the composition of the surface of the first film, the second film is formed on an entire exposed surface of the first film.

5. The method of claim 1, wherein a nitride film is further exposed on the surface of the substrate, and
    wherein in the act of changing the composition of the surface of the first film, the plasma-excited nitrogen-containing gas is supplied to the surface of the first film and a surface of the nitride film.

6. The method of claim 5, wherein the first film and the nitride film are exposed on the surface of the substrate so as to be adjacent to each other.

7. The method of claim 5, wherein the first film and the nitride film are exposed on the surface of the substrate so as to make contact with each other.

8. The method of claim 5, wherein a non-exposed portion of the first film is covered with the nitride film in a state in which the non-exposed portion of the first film makes contact with the nitride film.

9. The method of claim 5, wherein in the act of changing the composition of the surface of the first film, the composition of the surface of the first film is changed without changing a composition of the surface of the nitride film.

10. The method of claim 1, wherein the act of providing the substrate comprises forming the first film on the substrate by performing a cycle a predetermined number of times, the cycle comprising non-simultaneously performing:
    supplying a silicon-containing gas to the substrate;
    supplying a gas containing nitrogen and carbon to the substrate; and
    supplying an oxygen-containing gas to the substrate.

11. The method of claim 1, wherein the act of providing the substrate comprises:
    forming the first film on the substrate;
    forming a film different from the first film on the first film; and
    exposing the first film on the surface of the substrate by removing a part of the film different from the first film.

12. The method of claim 11, wherein the film different from the first film comprises a nitride film.

13. A substrate processing apparatus, comprising:
    a process chamber in which a substrate is processed;
    a nitrogen-containing gas supply system configured to supply a nitrogen-containing gas to the substrate in the process chamber;
    a plasma excitation part configured to plasma-excite a gas; and
    a controller configured to control the nitrogen-containing gas supply system and the plasma excitation part so as to perform, in the process chamber:
        providing the substrate that comprises a surface exposing a first film containing silicon, oxygen, carbon and nitrogen and having an oxygen atom concentration higher than a silicon atom concentration, which is higher than a carbon atom concentration, which is equal to or higher than a nitrogen atom concentration; and
        changing a composition of a surface of the first film so that the nitrogen atom concentration becomes higher than the carbon atom concentration on the surface of the first film, by supplying a plasma-excited nitrogen-containing gas to the surface of the first film,
    wherein in the act of changing the composition of the surface of the first film, a second film containing silicon, oxygen, carbon and nitrogen and having an oxygen atom concentration higher than a silicon atom concentration, which is higher than a nitrogen atom concentration, which is higher than a carbon atom concentration, is formed on the surface of the first film.

14. A non-transitory computer-readable recording medium storing a program that causes a computer to have a substrate processing apparatus perform, in a process chamber of the substrate processing apparatus:
    providing a substrate that comprises a surface exposing a first film containing silicon, oxygen, carbon and nitrogen and having an oxygen atom concentration higher than a silicon atom concentration, which is higher than a carbon atom concentration, which is equal to or higher than a nitrogen atom concentration; and changing a composition of a surface of the first film so that the nitrogen atom concentration becomes higher than the carbon atom concentration on the surface of the first film, by supplying a plasma-excited nitrogen-containing gas to the surface of the first film, wherein in the act of changing the composition of the surface of the first film, a second film containing silicon, oxygen, carbon and nitrogen and having an oxygen atom concentration higher than a silicon atom concentration, which is higher than a nitrogen atom concentration, which is higher than a carbon atom concentration, is formed on the surface of the first film.

* * * * *